(12) United States Patent
Fedder et al.

(10) Patent No.: US 7,749,792 B2
(45) Date of Patent: Jul. 6, 2010

(54) SELF-ASSEMBLING MEMS DEVICES HAVING THERMAL ACTUATION

(75) Inventors: Gary K. Fedder, Turtle Creek, PA (US); Altug Oz, Istanbul (TR)

(73) Assignee: Carnegie Mellon University, Pittsburgh, PA (US)

( * ) Notice: Subject to any disclaimer, the term of this patent is extended or adjusted under 35 U.S.C. 154(b) by 317 days.

(21) Appl. No.: 10/558,469

(22) PCT Filed: Jun. 2, 2004

(86) PCT No.: PCT/US2004/017137

§ 371 (c)(1),
(2), (4) Date: Nov. 28, 2005

(87) PCT Pub. No.: WO2005/001863

PCT Pub. Date: Jan. 6, 2005

(65) Prior Publication Data

US 2007/0103029 A1 May 10, 2007

Related U.S. Application Data

(60) Provisional application No. 60/474,973, filed on Jun. 2, 2003.

(51) Int. Cl.
*H01L 21/00* (2006.01)
*H01L 21/62* (2006.01)

(52) U.S. Cl. ............... 438/54; 257/9; 438/52; 438/53; 977/724; 977/725

(58) Field of Classification Search ............ 257/9; 438/52, 53, 54; 977/724, 725
See application file for complete search history.

(56) References Cited

U.S. PATENT DOCUMENTS 3,588,618 A * 6/1971 Otte ............ 361/809

(Continued)

FOREIGN PATENT DOCUMENTS

EP 1 089 109 A2 4/2001
WO WO 00/67268 11/2000

OTHER PUBLICATIONS

Y.B. Gianchandani, et al., "Bent-Beam Strain Sensors," Journal of Microelectromechanical Systems, vol. 5, No. 1, Mar. 1996.

*Primary Examiner*—Fernando L Toledo
(74) *Attorney, Agent, or Firm*—Jones Day; Edward L. Pencoske

(57) ABSTRACT

The present disclosure is broadly directed to a method for designing new MEMS micro-movers, particularly suited for, but not limited to, CMOS fabrication techniques, that are capable of large lateral displacement for tuning capacitors, fabricating capacitors, self-assembly of small gaps in CMOS processes, fabricating latching structures and other applications where lateral micro-positioning on the order of up to 10 μm, or greater, is desired. Principles of self-assembly and electro-thermal actuation are used for designing micro-movers. In self-assembly, motion is induced in specific beams by designing a lateral effective residual stress gradient within the beams. The lateral residual stress gradient arises from purposefully offsetting certain layers of one material versus another material. For example, lower metal layers may be side by side with dielectric layers, both of which are positioned beneath a top metal layer of a CMOS-MEMS beam. In electro-thermal actuation, motion is induced in specific beams by designing a lateral gradient of temperature coefficient of expansion (TCE) within the beams. The lateral TCE gradient is achieved in the same manner as with self-assembly, by purposefully offsetting the lower metal layers with layers of dielectric with respect to the top metal layer of a CMOS-MEMS beam. A heater resistor, usually made from a CMOS polysilicon layer, is embedded into the beam or into an adjacent assembly to heat the beam. When heated, the TCE gradient will cause a stress gradient in the beam, resulting in the electro-thermal actuation. Because of the rules governing abstracts, this abstract should not be used to construe the claims.

35 Claims, 14 Drawing Sheets

U.S. PATENT DOCUMENTS

| | | |
|---|---|---|
| 6,114,794 A | 9/2000 | Dhuler et al. |
| 6,275,034 B1 * | 8/2001 | Tran et al. .................. 324/252 |
| 6,633,260 B2 * | 10/2003 | Paschen et al. ........ 343/700 MS |
| 6,649,852 B2 * | 11/2003 | Chason et al. .............. 200/181 |
| 6,737,648 B2 | 5/2004 | Fedder et al. |
| 6,746,891 B2 * | 6/2004 | Cunningham et al. ......... 438/52 |
| 6,837,723 B1 * | 1/2005 | Randall et al. .............. 439/161 |
| 7,069,667 B2 * | 7/2006 | Bonham et al. ............... 33/645 |
| 7,085,122 B2 * | 8/2006 | Wu et al. .................... 361/277 |
| 7,253,488 B2 * | 8/2007 | Zhan et al. .................. 257/414 |
| 2003/0180981 A1 * | 9/2003 | Ishibashi et al. .............. 438/48 |
| 2004/0180465 A1 * | 9/2004 | Musolf et al. ................ 438/52 |
| 2005/0013087 A1 * | 1/2005 | Wu et al. .................... 361/303 |

* cited by examiner

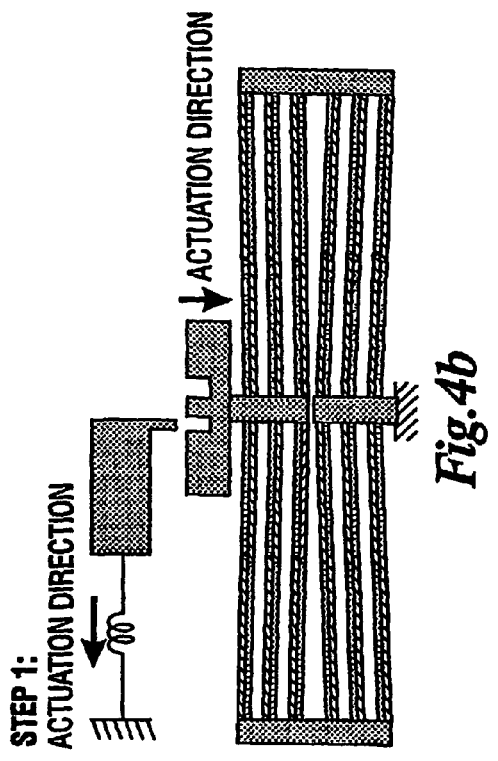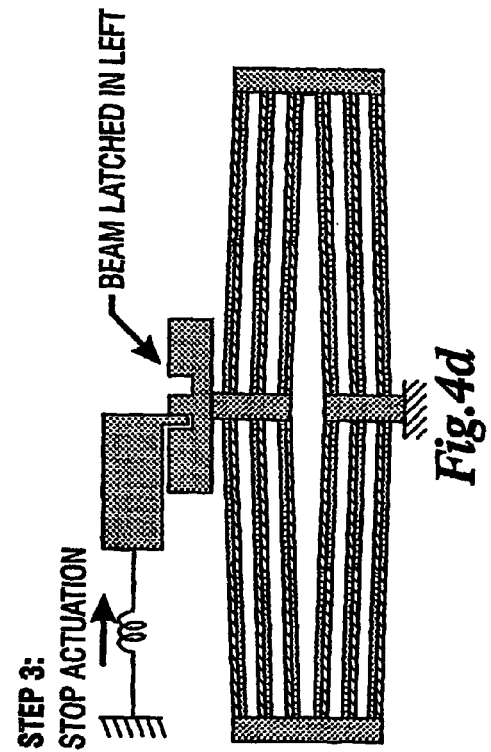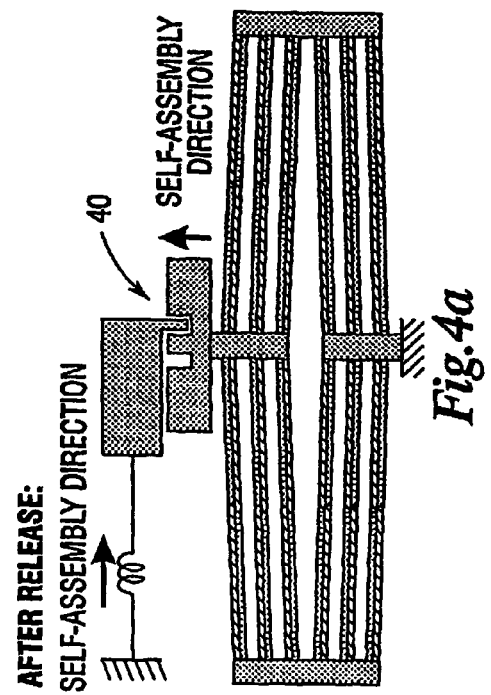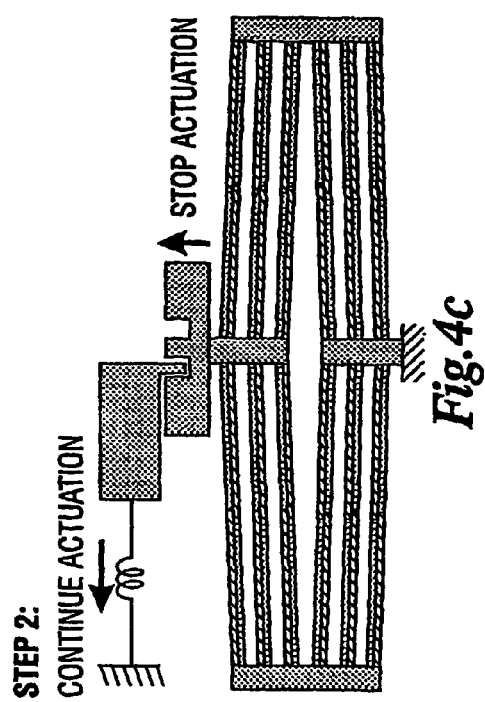

6.8 μm DISPLACEMENT UPON RELEASE

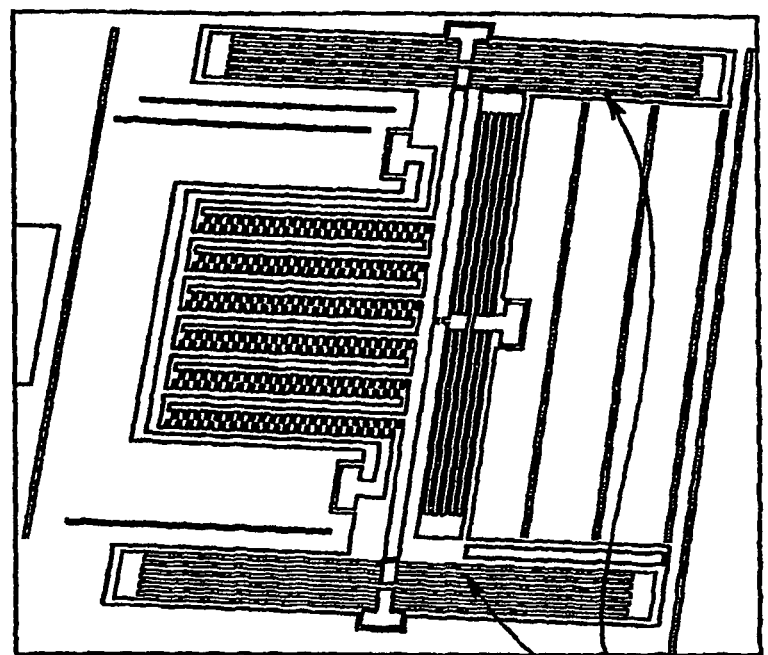
*Fig.15* — FULL SIZE ACTUATORS
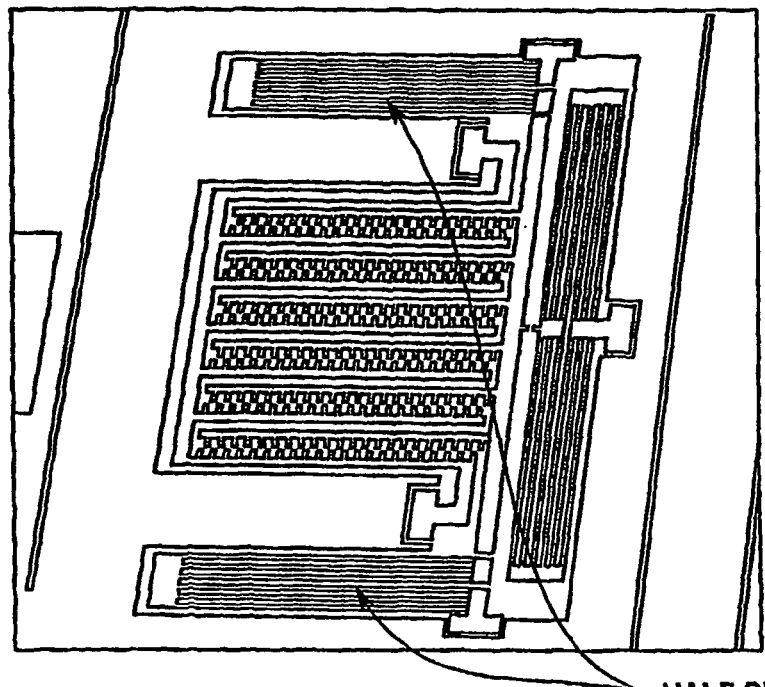
*Fig.16* — HALF SIZE ACTUATORS

SELF-ASSEMBLING MEMS DEVICES HAVING THERMAL ACTUATION

This application claims priority from PCT application Ser. No. PCT/US2004/017137 entitled Self-Assembling MEMS Devices Having Thermal Actuation filed on Jun. 2, 2004, and U.S. application Ser. No. 60/474,973 entitled CMOS Electrothermal Lateral Micromovers for Actuation and Self-Assembly and Their Use in RF-MEMS Tunable Capacitors filed Jun. 2, 2003, the entirety of which is hereby incorporated by reference.

STATEMENT REGARDING FEDERALLY SPONSORED RESEARCH

This invention was made with support of the United States government under Contract Nos. DAAB07-02-C-K001 and F30602-99-2-0545 awarded by the Defense Advanced Research Projects Agency (DARPA) and by the MARCO/DARPA Center for Circuits, Systems, and Software (C2S2). The United States government may have rights in this invention.

BACKGROUND

The present disclosure is directed generally to microelectromechanical systems (MEMS) and, more particularly, to MEMS beams, actuators and devices built therefrom.

Various micro-actuation techniques such as electrostatic, thermal, piezoelectric, or magnetic have been demonstrated. Actuators based on electrostatic forces have been commonly used, due to their low power and high frequency operation. Although electrostatic actuators have these advantages, they require high voltages (>40V) that are not compatible with most integrated circuit processes. The maximum forces produced by electrostatic actuators are generally in the range from up to 10 µN, which is lower than the forces produced by other types of microactuators. Large areas are needed for electrostatic actuator designs, which make system on-chip integration less feasible economically. Magnetic actuation uses the force of attraction and repulsion between a magnetic field produced by an electric current and a magnetic material. These types of actuators require extra fabrication steps. Piezoelectric actuators also have similar problems with processing complexity, as they require piezo-electric materials modified by high temperature steps. On the other hand, devices based on electrothermal actuation can provide large forces, large displacements, and low area consumption. They can also operate in an integrated circuit voltage regime (<5V). However, thermal actuators consume more power than electrostatic actuators. Generally thermal actuators are slower than the electrostatic actuators. Usually thermal time constants are longer than the electrical and mechanical time of constants. To alleviate this problem, the thermal mass of the actuators should be designed as small as possible.

Some of the early electrothermal actuator designs are based on the bimorph effect, which relies on the difference of thermal expansion coefficients between two adjacent layers on the device. By heating these layers, a bending moment is created. However such actuators produce deflection in the direction normal to the substrate. One of the microactuator designs by Reithmuller and Benecke with 2.5 µm thick locally deposited Au layer achieved 90 µm displacement by using 200 mW power from 0.05 mm² area. An electrothermal design by Sun and Carr uses the out of plane actuators to produce in-plane deflections. By using both electrothermal and electrostatic actuation at the same time, this actuator design can produce 30 µm lateral deflection with 40 mW power from 0.03 mm² area. Because of the fact that processing adjacent bimorph materials is so complicated, the lateral actuation mechanism is very difficult to achieve by using the bimorph approach. Judy et al. developed an actuator which achieved in plane actuation by using serpentine shaped actuators with complicated processing. One recent actuator design by Oz and Fedder uses the CMOS/BICMOS interconnect stacks for laying the bimorph materials to make the processing easier and to also achieve lateral deflections. This actuator demonstrated 3.5 µm deflection by using 18 mW power from 0.04 mm² area. Lateral "heatuator" microactuators are based on the asymmetrical thermal expansion of a microstructure, which has two different cross sections and is processed in one structural layer. The most recent design by Comtois, Michalicek and Baron can produce 20 µm deflection and 19 µN force with 37 mW power from a small area (0.01 mm²). The 3-db bandwidth for this design is 7 kHz, and maximum frequency for full deflection is 1.57 kHz. For the beam-bent actuators designed by Gianchandani et al., current is passed through the V-shaped beam anchored at two ends to cause a thermal expansion at the center of the actuator. A fabricated single device can produce 5 µm displacement and 8300 µN force with 180 mW from 0.01 mm² area, and some cascaded ones demonstrated 3 µm deflection and 132 µN force with 40 mW from 0.7 mm² area. The trade-off between power-area and force can be seen in these actuators. The measured −3 dB bandwidth for both cascaded and single devices is 700 Hz. To increase the output displacements, rotary actuators and inchworm designs are demonstrated by using multiple bent-beam thermal actuators orthogonally. For rotary actuator designs, the displacement is increased from 3 µm to 33 µm, but the power is also increased from 40 mW to 375 mW as multiple actuators are used. Zero-standby power is achieved by the inchworm designs, which means that the power is only needed during the switching time, not for the on or off cases. Sun, Farmer and Carr developed a similar zero-standby operation design by employing a mechanical latch structure. For near zero-power operation, a RF MEMS switch by Robert et al. is designed by a combination of thermal actuation and electrostatic latching. 400 mW of power is consumed for switching operation, but only 10 V is needed for the electrostatic latch mechanism with close to zero continuous power. The switching time for the electrothermal actuation is 200 µs.

There are several examples of applications in MEMS utilizing electrothermal actuators including: RF MEMS tunable capacitors, RF MEMS switches, an optical fiber micro switch, rotary micro-engines, micro-tweezers, and positioners.

Fabrication steps of integrated MEMS, compatible with the present microactuators, may use CMOS post-processing techniques. Structures are made using the CMOS interconnect stack and released with a maskless CMOS micromachining process. The high-aspect-ratio CMOS micromachining technology begins with a conventional foundry CMOS process. After the foundry fabrication, three dry-etch steps, shown in FIG. 1, are used to define and release the structure. FIG. 1(a) shows the cross section of the chip after regular CMOS fabrication. In the first step of post-CMOS processing (FIG. 1(b)), dielectric layers are removed by an anisotropic $CHF_3/O_2$ reactive ion etch (RIE) with the top metal layer acting as an etch resistant mask. After the sidewall of the microstructure is precisely defined, silicon trenches around the device are micromachined into the substrate using a deep RIE step (FIG. 1(c)). The final step is an isotropic $SF_6/O_2$ RIE used to etch away the bulk silicon and release the structure (FIG. 1(d)). Multi-layer conductors can be built in the composite structure, which enables more flexible designs than homogeneous conducting structures. The undercut of silicon in the release step (FIG. 1(d)) suggests placing the sensing circuits at least 40 μm away from the microstructures. A modified process flow uses photoresist or other material to mask the dielectric layer etch step, instead of using the top metal layer.

In prior work, Lakdawala et al made an infrared sensor from two in-plane bi-material beam elements. A stress gradient is created by heating the beams with infrared radiation and is caused from the change in temperature coefficient of expansion of the materials within the beam. The stress gradient produces a bending moment in each beam and causes the beams to move apart. The air-gap capacitance between the beams changes from the beam motion and is detected with a capacitive sensing circuit.

Over the past decade, MEMS technology has been widely used in applications such as optical communications, wireless systems, automotive sensors, aerospace systems, microrobotics, chemical sensors, biotechnologies, and micro probes. MEMS applications in the RF and microwave field have seen an incredible growth over the last decade stemming from the superior high frequency performance of RF MEMS switches. During those years, other RF and microwave MEMS devices have been designed such as tunable capacitors, inductors, micro-machined transmission lines, micromechanical resonators and filters.

For wireless industries, there is a continuing demand for RF high performance transceivers with lower-power, lower noise and smaller footprint. It is important to use high-quality factor (Q) passive components such as inductors, tunable capacitors and switches in RF front-end circuits for low power and low noise receivers. For oscillators and amplifiers, using a passive component with high-Q results in better phase noise and power consumption. The quality factor of on-chip inductors and MOS varactors is only on the order of low 10s at higher frequencies, therefore off-chip passive components capable of higher Q are widely used for RF front-end circuits. However, using an off-chip device increases the footprint of the receiver. Recent MEMS-based passive components achieved Qs of 30-100 at several gigahertz frequencies and have the potential to be used instead of the low-Q conventional on-chip passives. RF front-ends with these micro-machined passives still have large footprints, because they employ two separate die, one for micro-machined passives and one for electronics. On-chip MEMS passives are of interest, if they can be demonstrated to achieve higher Qs and smaller footprints from the same design.

There is also an increasing demand for multi-band radio architectures, because of the need for integration of different wireless systems with different operation frequencies. Tunable or reconfigurable receiver components are required for these multi-band RF front-ends. Most of the on-chip varactors have low tuning range (<3) and non-linear behavior. Over the past years, MEMS-based tunable capacitors also achieved large tuning ranges (>8) and linear behavior, but previous VCO designs with micromechanical tunable capacitors have not achieved wide tuning for VCO application. On-chip interconnects introduce fixed capacitance to the LC tank of the VCO, which decreases the tuning range Complete receiver systems on a single chip require voltage-controlled oscillators (VCOs) with gigahertz frequencies, and low phase noise and tunable RF filters with low insertion loss. Tunable capacitors with high Q are desired in VCOs and RF filters for achieving better performance. Micro-mechanical high-Q tunable capacitors have been used for VCO and RF filter applications. Other than the MEMS-based tunable capacitors, several other strategies, which include the implementation of MOS varactors or switched capacitor banks, have been used to achieve wide tuning range. Distortion and linearity are the two main problems associated with these approaches. Compared with solid-state varactors, MEMS tunable capacitors have advantages of lower loss, larger tuning range and more linear tuning characteristics.

In the past few years, many tunable capacitors based on MEMS technology have been designed. These capacitor designs can be classified into two categories according to their tuning mechanism; one category is gap tuning, and the other one is area tuning. MEMS-based RF tunable capacitors can also be classified according to their actuating mechanisms which are; electrostatic, electrothermal, and piezoelectric, discussed above.

Some of the early gap tuning designs have low tuning ranges, because of the parasitic capacitances coming from interconnects. The parallel-plate capacitor designs with electrostatic actuators have a theoretical 50% tuning range limitation, because the electrodes snap after the gap between them becomes ⅔ of the initial gap. The parallel-plate vertical gap device demonstrated by Young and Boser has a tuning range of 16% and quality factor of 60 at 1 GHz. A VCO is implemented at 714 MHz operating frequency with 14 MHz tuning range and a phase noise of −107 dBc/Hz at 100-kHz offset. A modified parallel-plate RF tunable capacitor is designed to increase the tuning range larger than the 50% limit by using three parallel plates. From a 4 pF capacitor design, a tuning range of 87% with 4.4 V controlling voltage and Q of 15.4 at 1 GHz are achieved. A VCO is also demonstrated with 24 MHz tuning at 1.336 GHz operating frequency and phase noise of −98.5 dBc/Hz at 100-kHz offset. A parallel plate design by Zou et al. used a novel electrode design to achieve a tuning range larger than the 50% snap-in limit. For this design, larger gaps are used in the electrostatic actuation mechanism, compared to the gaps between the electrodes of the capacitor. A tuning range of 69% is achieved by using 17 V driving voltages. Designs based on a cantilever beam also achieve tuning ranges larger than 50%. The initial design by Hung and Senturia has a tuning range of 81.8% with 40V controlling voltage. Later designs have Q of 4 at 3 GHz and large tuning range of 354% with 40 V controlling voltage. Parallel-plate capacitor designs using electrothermal and piezo-electric actuation do not have the 50% tuning range limitation. A parallel-plate capacitor by Feng et al. based on thermal actuation has lower driving voltages around 7 V, compared to the capacitor based on electrostatic actuation. It has also large tuning ranges of 270% and high-Q factor of 300 at 10 GHz. Yao et al. developed a capacitor based on piezoelectric actuation that has a Q factor of 210 at 1 GHz with a 6 V controlling voltage.

The area tuning RF MEMS capacitors are demonstrated to solve the snap-in tuning range limitation, when electrostatic actuation is used. Early devices achieved a tuning range of 300% with 5 V controlling voltage. Interdigitated finger structures with 30 μm thickness are used for capacitor electrodes and the electrostatic actuation mechanism. Recent designs use thicker and longer finger blocks to increase the tuning range and the quality factor. Tuning ratio of 8.4:1 with 8 V controlling voltage and Q factor of 35 at 2 GHz is demonstrated by using 40 μm thick finger electrodes. Having a 12 pF nominal capacitance value and Q-factor of 200 at 400 MHz enables UHF filter applications for these capacitor designs. A UHF filter with tuning range of 225-400 MHz is developed with an insertion loss of 6.2 dB and Q factor of 100 for the operating frequency ranges. The most recent capacitor design by Rockwell Science Center achieves a linear tuning characteristic by forming a completely electrically isolated capacitor. Two sets of electrostatic comb drive actuators in opposing directions are used to achieve a linear tuning characteristic. Another area tuning design uses the idea that the dielectric between the electrodes is moved laterally to achieve high-Q factors. Using a dielectric that has large dielectric constant enables high-Q factors, because the same device would have bigger capacitance with the same resistance losses. Q factors of 291 at 1 GHz and a tuning range of 7% with 10 V controlling voltage is demonstrated. The biggest issue of these MEMS devices is the use of separately fabricated CMOS/BICMOS electronics. For VCO and RF filter designs, on-chip and off-chip interconnects between separate dies introduce large fixed capacitance to the LC tank, which decreases the tuning range.

SUMMARY

The present disclosure is directed to a MEMS device comprising an in-plane, self-assembling beam. "Self-assembling" means that the beam moves into a desired position upon being released from the substrate or upon the application of non-device specific heating, e.g. heating the entire die. The device may be locally heated as well. Such a beam can be used to build larger devices, such as a MEMS actuator comprising a first leg having a fixed end and a movable end, the first leg having an in-plane, self-assembling construction, and a second leg having a first end connected to the movable end of the first leg, and a second end defining an actuator, the second leg having an in-plane, self-assembling construction. The legs of the actuator may each be either a single beam or a plurality of parallel beams.

Another example of a MEMS actuator constructed using the disclosed beam is comprised of a first leg having a fixed portion and two movable ends, the first leg having an in-plane, self-assembling construction, and a second leg having a first end connected to one of the movable ends of the first leg and a second end connected to the other of the movable ends of the first leg, the second leg having an in-plane, self-assembling construction. An actuator is carried by the second leg. The legs of the actuator may each be either a single serially connected pair of beams or a plurality of serially connected pairs of beams in parallel with one another.

The present disclosure is also directed to a MEMS device comprised of at least one beam having at least two materials arranged so as to provide an in-plane stress gradient of sufficient magnitude to enable the beam to move in-plane upon the beam's release. The two materials may include, for example, a metal and a dielectric arranged about a dividing line such that there is more metal than dielectric on one side of the line and more dielectric than metal on the other side of the line. With such a construction, lateral stress can be predetermined as a function of beam length. The two materials may be selected so that one of the two materials has a greater compressive force, also known as compressive residual stress, than the other of the two materials, one of the two materials has a greater tensile force, also known as tensile residual stress, than the other of the two materials, or one of the two materials has a compressive force and the other of the two materials has a tensile force.

According to another embodiment of the present disclosure, a thermal heater is provided to thermally induce a stress gradient in a direction opposite to the in-plane residual stress gradient to cause movement in the opposite direction. In such an embodiment, one of the two materials has a coefficient of thermal expansion greater than a coefficient of thermal expansion of the other of the two materials. It is also possible to choose the two materials such that the in-plane thermal stress gradient is in the same direction as the in-plane residual stress gradient.

According to another embodiment of the present disclosure, two such devices may be constructed, with the second device positioned with respect to the first device such that the actuator of the second device may inhibit movement of the first device. In such an embodiment, the second device may be positioned orthoganally with respect to the first device. The actuator of the second device may carry a surface for engaging the first device.

The actuators disclosed herein may be used to build devices such as capacitors and devices having nano-scale gaps. For example, a MEMS variable capacitor has a plurality of capacitive surfaces connected to an actuator of a MEMS device constructed according to any of the embodiments disclosed herein. A MEMS device defining a nano-meter sized gap may be comprised of a stop surface having a recess formed therein so as to define one side of the gap. An actuator or piston of a MEMS actuator constructed according to any of the embodiments disclosed herein is designed to engage the stop surface and to provide the other side of the gap.

The present disclosure is also directed to a method of building an in-plane, self-assembling MEMS beam. The method is comprised of: selecting two materials; forming the two materials into a beam such that the beam has an in-plane stress gradient of sufficient magnitude to enable the beam to move in-plane upon the beam's release. The two materials may include a metal and a dielectric arranged about a dividing line such that there is more metal than dielectric on one side of the line and more dielectric than metal on the other side of the line. The lateral stress gradient may be formed so as to be a function of beam length. The two materials may be selected such that one of the two materials has a greater compressive force than the other of the two materials, one of the two materials has a greater tensile force than the other of the two materials, or such that one of the two materials has a compressive force and the other of the two materials has a tensile force. The two materials may additionally be selected such that upon heating, a thermally induced stress gradient is generated that is in a direction opposite to the in-plane stress gradient. In such an embodiment, one of the two materials has a coefficient of thermal expansion greater than a coefficient of thermal expansion of the other of the two materials. The two materials may be selected, in an alternative embodiment, such that the in-plane thermal stress gradient is in the same direction as the in-plane residual stress gradient. Beams with more than two materials may be fabricated with these same general self-assembly properties.

The present disclosure is broadly directed to a method for designing new MEMS micro-movers, particularly suited for, but not limited to, CMOS fabrication techniques, that are capable of large lateral displacement for tuning capacitors, fabricating capacitors, self-assembly of small gaps in CMOS processes, fabricating latching structures and other applications where lateral micro-positioning on the order of up to 10 µm is desired. Lateral micro-positioning larger than 10 µm is possible by making larger micro-movers, because the displacement scales with device area. Principles of self-assembly and electro-thermal actuation are used for designing micro-movers. In self-assembly, motion is induced in specific beams by designing a lateral effective residual stress gradient within beams. The lateral residual stress gradient arises from purposefully offsetting certain layers of one material versus another material. For example, lower metal layers may be side by side with dielectric layers, both of which are positioned beneath a top metal layer of a CMOS-MEMS beam. In electro-thermal actuation, motion is induced in specific beams by designing a lateral gradient of temperature coefficient of expansion (TCE) within the beams. The lateral TCE gradient is achieved in the same manner as with self-assembly, by purposefully offsetting the lower metal layers with layers of dielectric with respect to the top metal layer of a CMOS-MEMS beam. A heater resistor, usually made from a CMOS polysilicon layer, is embedded into the beam or into an adjacent assembly to heat the flexure. When heated, the TCE gradient will cause a stress gradient in the beam, resulting in the electro-thermal actuation.

An addition to the beam design is to include vias, available in the CMOS or BiCMOS process, inside the beam between the offset metal layers. The presence of the vias offset in the same manner as the lower metal layers has been shown to create greater stress gradients and bending than designs without the vias.

The present disclosure represents an advancement over prior methods of designing electro-thermal actuators and micro-movers that enables high displacement magnitude with small geometry. The new ability is to design from layout, and thereby tailor, the lateral stress gradients and gradients of temperature coefficient of expansion into the actuation beams. Prior work exploits differences only in axial expansion coupled with mechanical lever action to produce motion. The present disclosure has the further advantage of being compatible with CMOS and hybrid CMOS/SiGe bipolar processes, which enables less resistive losses and less parasitic capacitance for RF MEMS tunable passive applications, although the present disclosure need not be limited to such processes. Several RF-MEMS tunable capacitor designs with these CMOS electro-thermal actuators have been fabricated and tested. The present disclosure also has other advantages such as lower driving voltages and lower power consumption compared to the prior works. This design is capable of up to 25 μm lateral displacement with a length of 220 μm and a width of 22 μm. The 25 μm lateral deflection for such dimensions is more area efficient than previous designs. For comparison, one recent prior actuator design produced 2.7 μm deflection with 800 μm diameter circular area. Similarly, in prior work bent-beam electro-thermal actuator designs 800 μm long and 13.9 μm wide demonstrated deflection of 5 μm.

The structures disclosed herein were made from the CMOS interconnect stack using a maskless CMOS micromachining process. These 1st generation actuators were fabricated using Austria Microsystems (AMS) 0.6 μm CMOS process and Agilent 0.5 μm CMOS process. $2^{nd}$ generation electro-thermal actuator designs in Taiwan Semiconductor Manufacturing Company (TSMC) 0.35 μm CMOS process and the Jazz Semiconductor 0.35 μm BiCMOS/SiGe process have more area efficiency than the 1st generation designs. For 5.5 μm actuation, the 2nd generation actuators with a length of 224 μm and a width of 22 μm consume 18 mW of power with 6V control voltage.

This application further discloses new CMOS-compatible tunable capacitors using the disclosed electro-thermal actuators. Previous designs use separately fabricated CMOS electronics for potential applications like VCOs or tunable filters, as the capacitors have not been CMOS compatible. An advantage of this approach is that CMOS electronics for VCOs and other possible applications can be integrated on the same chip, thereby eliminating losses coming from interconnects between chips. For $2^{nd}$-generation tunable capacitors in the TSMC 0.35 μm CMOS process, a tuning range of 3.52:1 has been measured. Those advantages and benefits, and others, will be apparent from the Detailed Description appearing below.

BRIEF DESCRIPTION OF THE DRAWINGS

For the present disclosure to be easily understood and readily practiced, the present disclosure will now be described, for purposes of illustration and not limitation, in conjunction with the following figures, wherein:

FIGS. 4(a) through 4(d) illustrate the operation of a simple latching scheme that can use actuators of the designs disclosed herein to move between and latch in either of two pre-determined positions.

FIG. 6 (a) illustrates an actuated device as initially released. FIG. 6 (b) illustrates the same device moved into position by a process such as electro-thermal actuation, and latched into the desired configuration by the use of an angled sidewall and an angled peg.

FIG. 7 (a) is a top layout view of the mirror and two self-assembly mechanisms that act as clamps. FIG. 7 (b) is a side view of the mirror illustrating the placement of the actuator piston clamping onto the mirror.

FIG. 19 shows SEMs of a tunable capacitor made in accordance with the $2^{nd}$ generation design disclosed herein. FIG. 9 (b) shows more details of the small finger beams in a disengaged configuration, while FIG. 9 (c) shows the small finger beams in an engaged configuration.

FIG. 15 is an SEM of a capacitor made in accordance with the 2$^{nd}$ generation design disclosed herein. This capacitor uses the "full size" actuators.

FIG. 16 is an SEM of another capacitor made in accordance with the 2$^{nd}$ generation design disclosed herein. This capacitor uses the "half size" actuators.

DETAILED DESCRIPTION

Figure 1A:
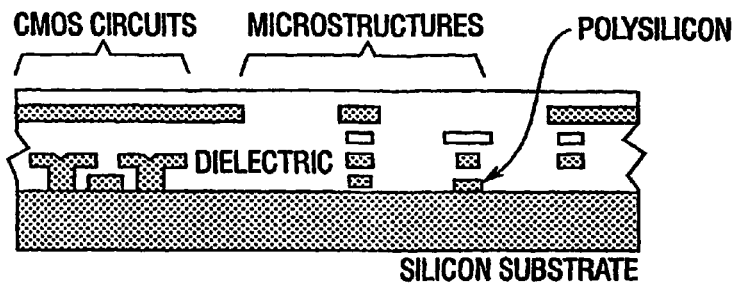
FIG. 1 illustrates a prior art CMOS-compatible process used to create MEMS devices.
Figure 1B:
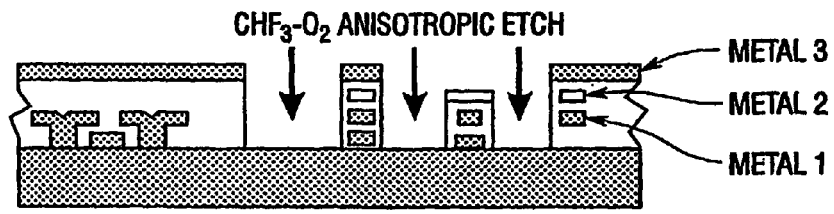
Figure 1C:
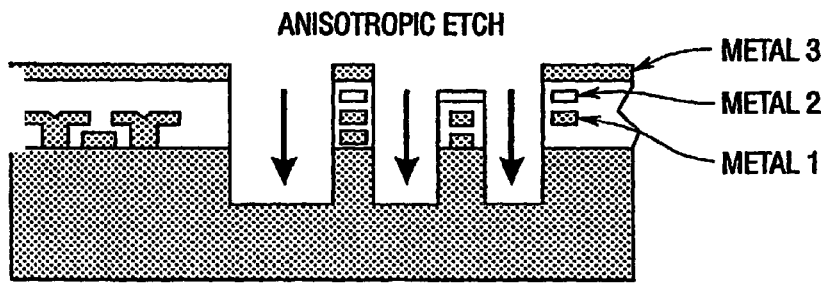
Figure 1D:
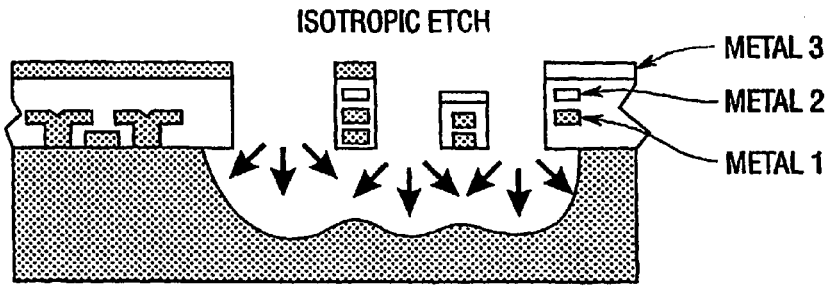

Electro-thermal CMOS-MEMS designs are capable of large lateral displacement for tuning capacitors, self-assembly of small gaps, switches and other applications where micro-positioning on the order of 1 to 20 µm is desired. Motion is induced in specific beams by designing a lateral stress gradient within beams. The lateral stress gradient arises from purposefully offsetting the lower metal layers with respect to the top metal layer of a CMOS-MEMS beam. Of particular benefit is the ability to tailor the lateral stress gradient, and therefore lateral moment, as a function along the beam length. This ability to set an internal moment along the beam arises from different offset and width of the embedded layers. The microstructures can be made from the CMOS interconnect stack using a maskless CMOS micromachining process, however these beams could be made in alternate custom processes, and it is not intended that this disclosure be limited to CMOS processes. For example, the microstructures can also be made in hybrid CMOS/SiGe bipolar processes. The CMOS-MEMS beams are made from metal layers embedded within a dielectric (silicon oxide and silicon nitride). The offset layers do not have to be metal, and do not have to be embedded in dielectric. However, this particular design technique is particularly advantageous in CMOS-MEMS, because no special processing must be done to implement the designs.

The primary concept of the lateral actuator is illustrated in FIG. 2. This particular design is a folded-flexure to relieve axial residual stress, as shown in FIG. 2(a). In FIG. 2(a), the actuator 10 is comprised of a first leg 12 having a first movable end 14 and a second movable end 16. The first leg is anchored in the middle to an anchor 18. The actuator 10 is further comprised of a second leg 20 having a first movable end 22 connected to the first movable end 14 of the first leg 12 and a second movable end 24 connected to the second movable end 16 of the first leg 12. The second leg carries a movable piston 26. The first leg 12 and second leg 20 may each be comprised of a pair of single beams 28, 28 and 28', 28', respectively, or a plurality of pairs of parallel beams may be provided as shown to provide increased stiffness.

Figure 2A:
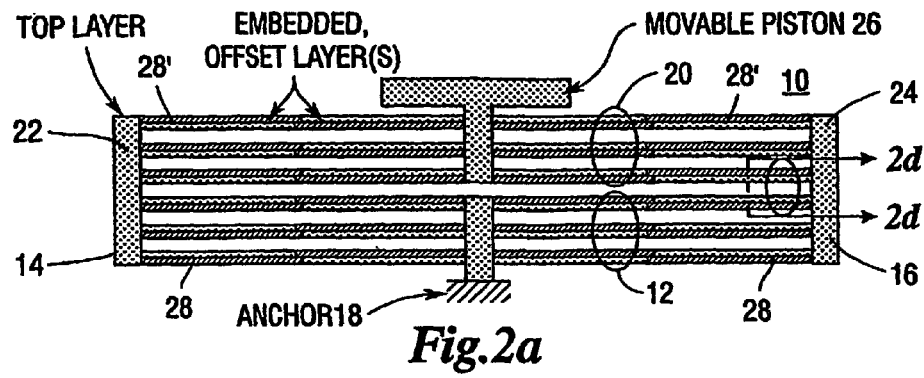
FIG. 2(a) is a top view looking down on one embodiment of an actuator, including an electro-thermal heater, according to the present disclosure, before the release step.
Figure 2B:
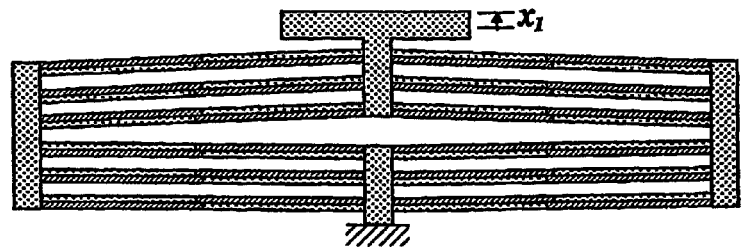
FIG. 2(b) illustrates the same actuator after release, demonstrating the self assembly aspect of the present disclosure.
Figure 2C:
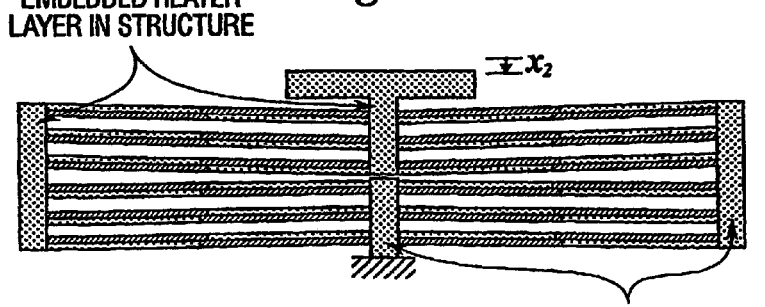
FIG. 2(c) illustrates the same actuator after electrothermal heating, demonstrating actuation.
Figure 2D:
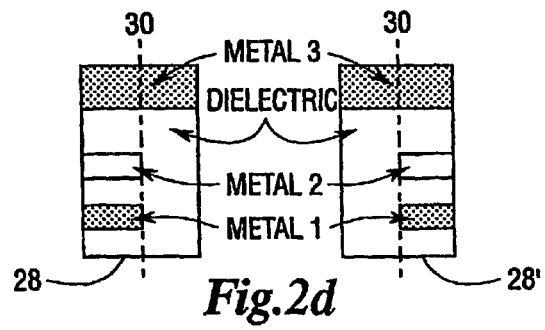
FIG. 2(d) is a cross-section view of two of the beams of the actuator.

The metal layers inside the flexure beams 28, 28' of each leg are offset to one side of the beam, e.g. arranged around an imaginary dividing line 30 as seen in FIG. 2(d), for half the beam length, and to the other side for the remaining half of the length. This arrangement provides a lateral stress gradient in one direction for half of the beams, then to the other direction for the other half. For many CMOS-MEMS processes, the residual stress in the offset aluminum layers is tensile, while the residual stress in the surrounding silicon oxide layers is compressive. Therefore, the aluminum expands and the silicon oxide contracts once freed to move. Upon release, this tailoring of stress provides a self-actuating operation, where the beams move into a "S" shape, as shown in FIG. 2(b). This shape greatly reduces or, in some situations, eliminates any moments at the ends of the beam, and therefore maximizes lateral motion with no rotation. Some residual moment may exist at the ends of the beam due to manufacturing variation along the beam, though this is small. The design methodology for placement of the inner metal layers aims to set the beam moment so as to mimic bending from an external actuating force concentrated at the central piston. Sub-0.5 micron CMOS processes generally have lower residual stress in both the aluminum and silicon oxide layers. Some CMOS processes provide aluminum layers with compressive residual stress. In all cases, efficient CMOS-MEMS electro-thermal actuators can be designed.

The stiffness of the flexure in FIG. 2 can be modified independent of the deflection. The particular design in FIG. 2 employs 12 beams. Additional beams, ideally in a symmetric arrangement, may be added to increase the stiffness. This is a great advantage over electrostatic microactuation schemes.

A simplified version of the actuator 10 may be constructed by reducing leg 12 to one beam 28 extending from anchor 18 to movable end 14 and reducing leg 20 to one beam 28', connected at one end to end 14 and carrying the actuator 26 at substantially the other end of beam 28'. Such a design is sometimes referred to herein as a "half size actuator". Of course, additional beams may be added in parallel with beams 28, 28' to provide increased stiffness. The particular form of the actuator, half size vs full size, single vs multiple beams in parallel, etc., are matters of design choice dictated by such factors as layout space available, geometry of the available space, required force, etc. The present disclosure is not to be limited by such matters of design choice; the present disclosure encompasses all forms of actuator 10 dictated by such matters.

Electrothermal actuation can be applied to any designed actuator. The heating is implemented in CMOS-MEMS by embedding a polysilicon resistor 32 inside the beam as shown in FIG. 2(c). Current flowing through the resistor generates the heating power. Motion is induced from the different Temperature Coefficient of Expansion (TCE) of the metal offset layers and the rest of the beam material (silicon oxide). In the case of CMOS-MEMS, the offset aluminum layers have a much larger TCE than the surrounding silicon oxide. When heated, a thermal stress gradient is induced such that the side of the beam with the aluminum offset will expand relative to the other side. This effect leads to the actuated lateral motion, as illustrated in FIG. 2(c), which is opposite to the motion induced by the mechanical stress gradient designed into the actuator 10.

Figure 2E:
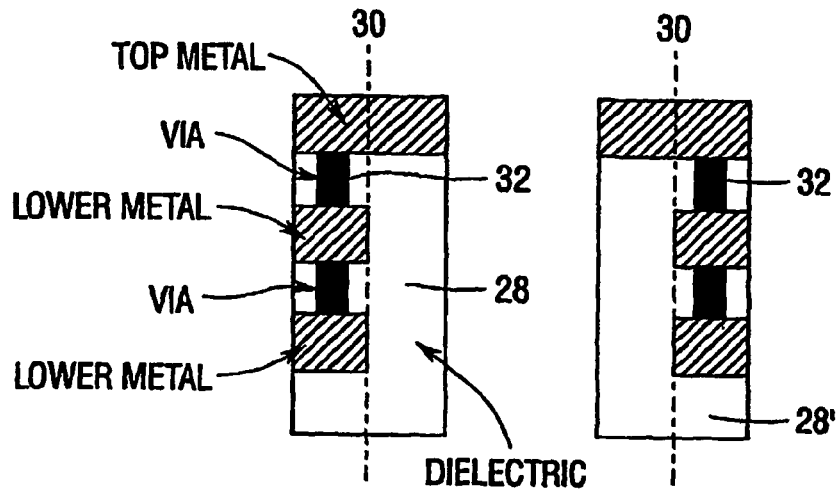
FIG. 2(e) is a cross section view of two of the beams of the actuator using vias offset within the beam.

FIG. 2(e) illustrates a modified beam construction in which a plurality of vias are added, as closely packed as desired, to increase the amount of metal. Other methods for increasing the amount of metal, e.g. filling a trench, may be employed depending upon the fabrication process being employed.

Figure 3:
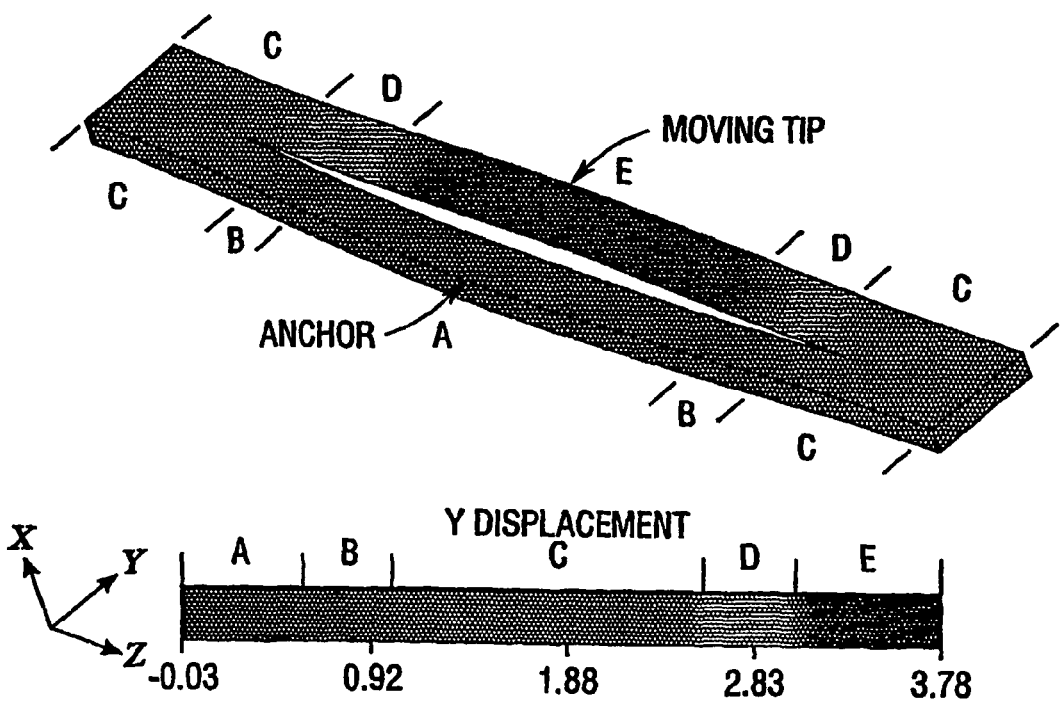
FIG. 3 illustrates the results of a Finite Element Analysis simulation used to calculate the lateral displacement of an actuator designed in accordance with the present disclosure.

Displacement magnitudes of the lateral actuation can be verified quantitatively by finite element analysis (FEA). For FEA, a simulation temperature, $T_{set}$, is calculated to model the lateral actuation magnitude upon release of the actuator.

$$T_{set} = -T_o + T_{sim} + T_d \tag{1}$$

where, $T_{sim}$, is the simulator initial temperature, usually 273 K, and $T_d$ is the ambient temperature. $T_o$ denotes the characteristic temperature at which the beam has zero deflection. FIG. 3 shows a simulation result for lateral displacement of the 1$^{st}$ generation actuator design in AMS 0.6 µm CMOS process with a length of 220 µm and a width of 22 µm at 113° C. As it can be seen from FIG. 3, the lateral displacement magnitude at the tip of the actuator is 3.78 µm. Lateral displacements of this 1<sup>st</sup> generation actuator design at different ambient temperatures are given in Table 1.

TABLE 1

| Temperature (° C.) | Simulated Lateral Displacement |
| --- | --- |
| 27 | 7.36 µm |
| 36 | 6.95 µm |
| 70 | 5.5 µm |
| 100 | 4.34 µm |
| 135 | 2.88 µm |
| 150 | 2.25 µm |

Electro-thermal actuators consume more power in continuous operation compared to electrostatic actuators. The continuous power required to sustain displacement can be reduced to mW levels, however this is still too large for some applications. For example, it is desirable to use zero continuous power for tunable RF capacitors to compare well with the low power of varactor diodes. It is therefore advantageous to find a method to selectively latch the actuators into desired positions so that power does not have to be continuously supplied. Many variations of latch mechanisms can be designed. The latch principle shown in FIG. 4 is not meant to be comprehensive, but illustrates the general concept. The simplest latch uses two actuators 10. One actuator actuates a device, for example, a tunable capacitor plate (not shown) while the second actuator latches the latch 40. The latch 40 shown in FIG. 4 is a peg/slot configuration, although any type of latch may be implemented, including a clutch-like latch in which one surface, which may be corrugated or smooth, on the movable piston 26 of one actuator engages the other actuator and prevents further movement. In the design as illustrated, the peg can be any shape that mates together with the corresponding slot shape. A simple rectangular shape is shown in FIG. 4. The peg may be located on the "latch" actuator with the slot located on the "device" actuator, as shown in FIG. 4, or their respective locations may be swapped. The two actuators may be of the same design, or may be of a different design from one another, and may take any of the previously discussed designs, i.e. they need not be limited to the full size design shown in the figure.

In FIG. 4(a), the process starts at zero power with the peg and one of the slots in an engaged position. This engaged position may be formed through self-assembly of the actuators, or may be formed as drawn in the layout if there is little or no motion from self-assembly. The device is then set to a new position by a set of sequential steps. In the first step, shown in FIG. 4(b), the latch actuator is electro-thermally actuated, pulling the peg away from the first slot. In the second step, shown in FIG. 4(c), the device actuator is electro-thermally actuated to a new position corresponding to a different second slot. In the third step, heating power to the latch actuator is turned off, and the peg becomes engaged with the second slot. In the fourth step, which results in a configuration identical to that shown in FIG. 4(d), heating power to the device actuator is turned off, and the slot and peg remain in contact with each other keeping the device in its new position. The latch actuator must be designed with adequate mechanical stiffness to hold the peg in place. As a guideline, the stiffness of the latch mechanism in the direction of the device actuator's displacement should be at least 10 times greater than the stiffness of the device actuator. A bistable latch mechanism with two slots is shown in FIG. 4, however any number of slots can be designed as long as the actuator stroke can accommodate the slots. Any number of latch mechanisms can be used with a given device, as long as there is layout area to fit the required actuators.

Figure 5A:
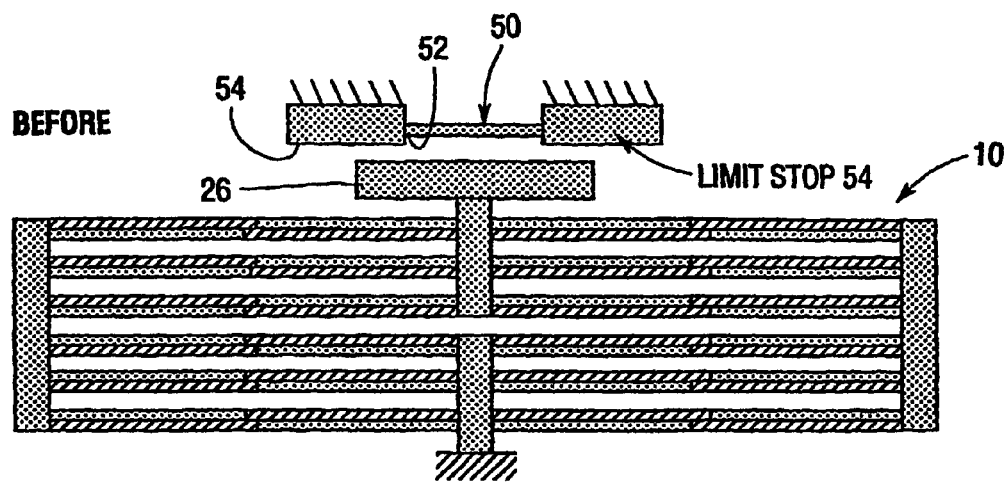
FIGS. 5(a) and 5(b) illustrate the use of actuators of the designs disclosed herein to create nanometer-scale gaps.
Figure 5B:
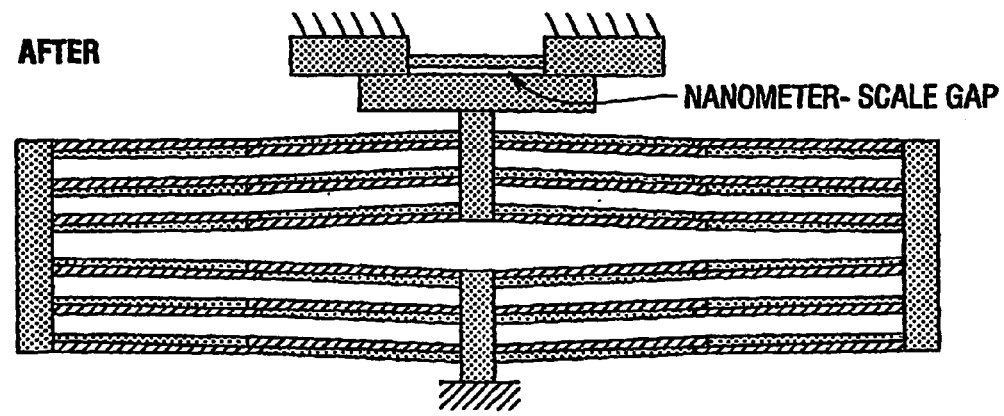

An application of the actuators and latch mechanisms is in assembling lateral nanometer-scale sidewall gaps for large capacitance and large electrostatic force per area. Desirable sizes range from about 50 nm or less to 500 nm. These nanometer-scale gaps are particularly useful for improving the performance of high-frequency nanoresonator devices. Conventional optical lithography limits gap width in the CMOS microstructures to around 0.5 µm. Smaller gaps have been made in some other micromachining processes, for example by forming a thin sacrificial oxide layer between silicon or polysilicon electrodes. In our assembly approach, the gap as drawn in layout is much larger than the final nanometer-scale dimension, as shown in FIG. 5. One electrode of the gap may be a nanoresonator, exemplified by the fixed-fixed beam 50 in FIG. 5(a). The beam 50 has a recess 52 formed thereinbetween limit stops 54, the recess 52 defining one wall or electrode of the gap. The other wall/electrode of the gap is defined by the piston 26 of the actuator 10. The actuator 10 shifts the piston/electrode 26 upward in the figures to narrow the gap. The rigid limit stops 54 set the desired final gap value or dimension as shown in FIG. 5(b). Because the limit stop edge and the beam edge face the same direction, any overetch or underetch in the processing will not affect the gap dimension. Theoretically, the gap can be set to an arbitrarily small value, however the practical minimum gap is determined by the surface roughness of the sidewalls, estimated to be less than 50 nm. A self-assembly actuator of the present disclosure is ideal for this application, requiring zero power. However, some CMOS processes have such low residual stress gradients that making self-assembly actuators is impractical. In these cases, an electro-thermal actuator shifts the piston/electrode 26 and closes the gap. To maintain the gap closure without expending continuous power in the actuator 10, a self-aligning latch mechanism can be included.

Figure 6A:
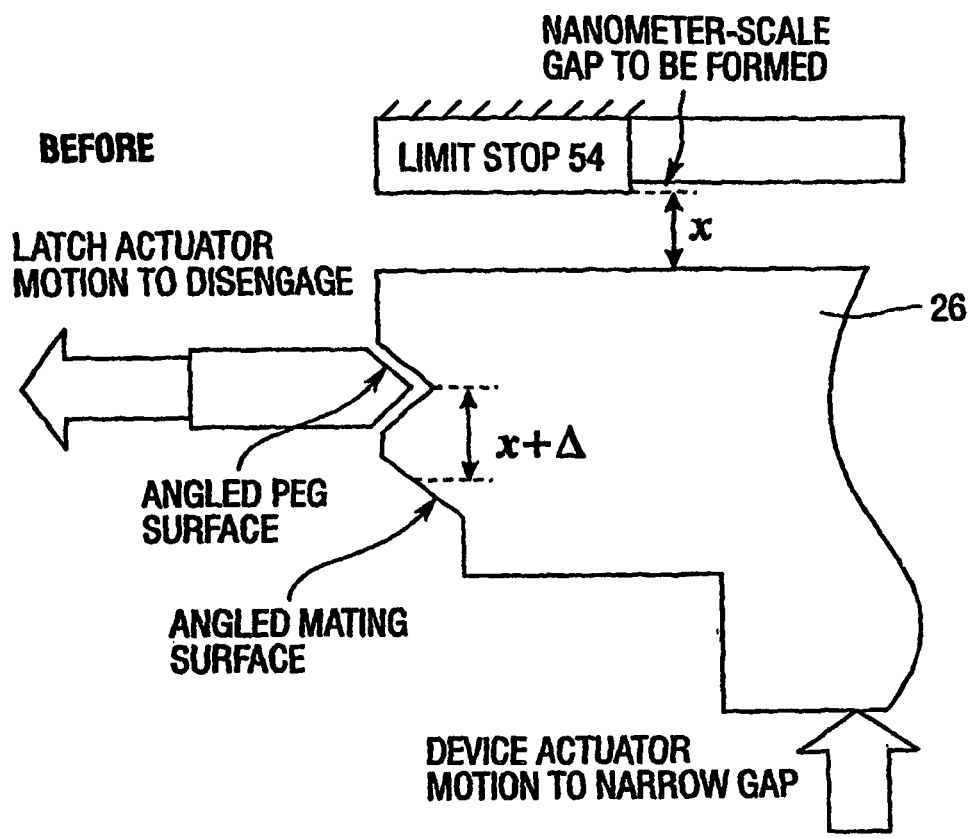
FIG. 6 illustrates how angled surfaces may be used to form a self-aligning latch for use in creating a nanometer-scale gap.
Figure 6B:
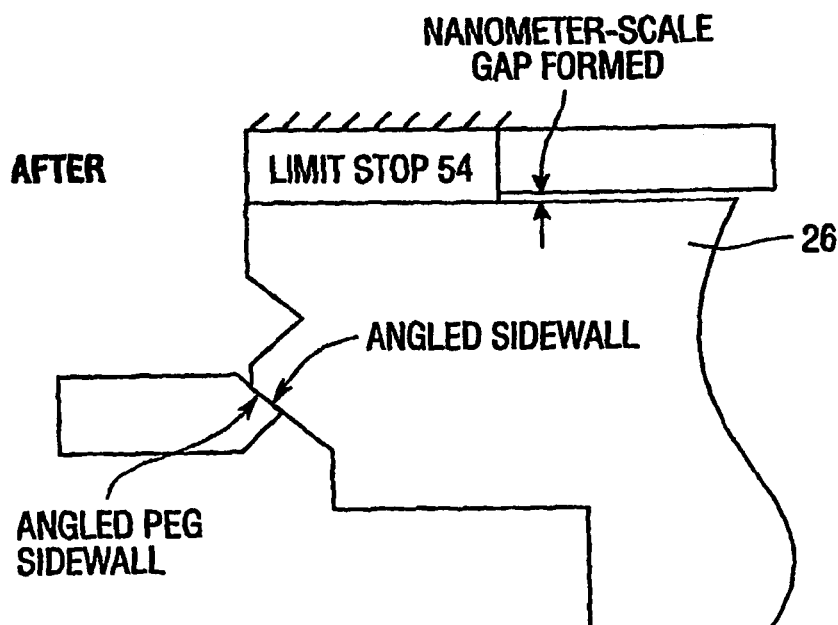

One embodiment of a self-aligning latch is shown in FIG. 6. An angled sidewall surface is located on the side of the piston/electrode 26. An angled peg is designed to mate with the sidewall surface. The peg is actuated with a second thermal actuator (not shown). To narrow the gap, both actuators are actuated as shown in FIG. 6(a). The peg moves away from the device and allows the first actuator to narrow the gap. The latch actuator is then turned off, moving the peg into place and mating with the angled sidewall surface as shown in FIG. 6(b). The device displacement is designed to be slightly smaller than the distance between the mating surfaces as drawn in layout. This ensures a contact force between the two angled surfaces, even with manufacturing overetch or underetch variations. The two angled surfaces self-align and keep the electrode pushed into its final position creating the nanometer-scale gap. The latch actuator must be designed with adequate mechanical stiffness to hold the peg in place. The combination of moving electrode with limit stop and latch can be used for any other application requiring a static deflection on the order of up to 10 µm with zero power.

Figure 7A:
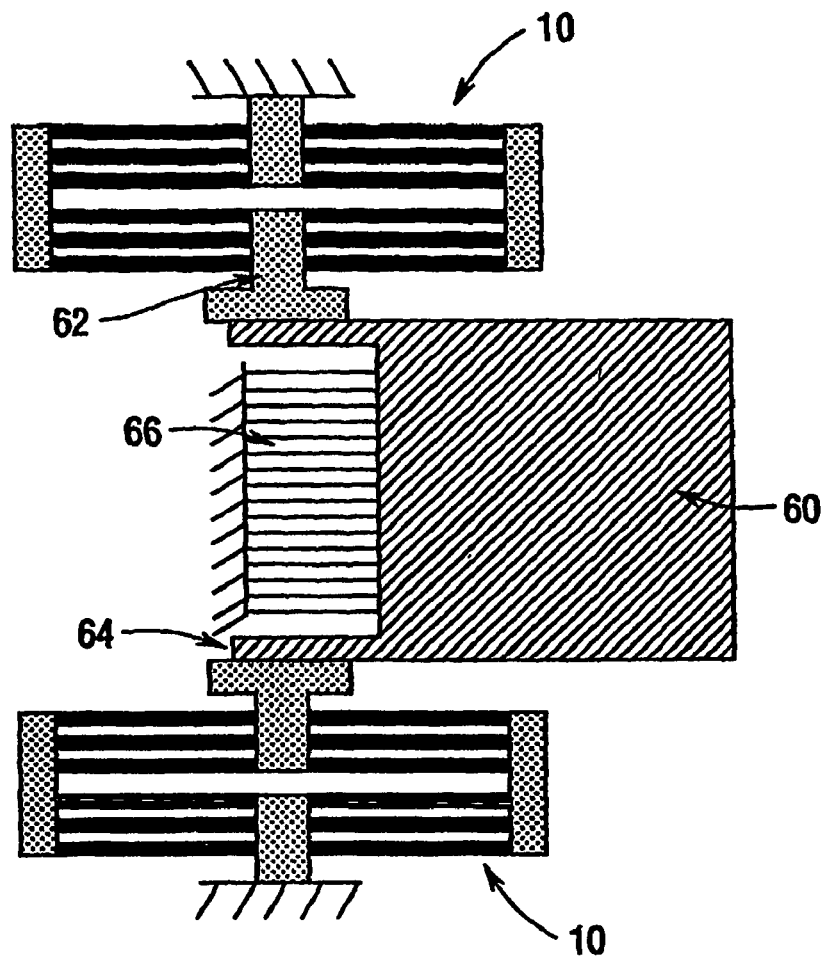
FIG. 7 illustrates how self-assembly mechanisms may be used to hold a micro-mirror or other mechanism actuated out of plane.
Figure 7B:
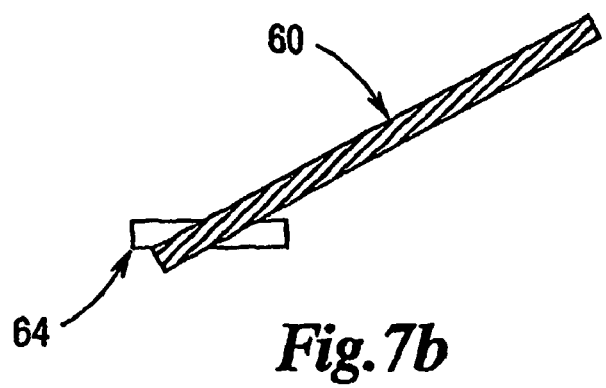

Another application of the disclosed self-assembly mechanisms and actuators is to hold at a fixed position mechanisms that are actuated out-of-plane. One example is in holding micro-mirror mechanisms 60 at a specific angle as shown in FIGS. 7(a) and 7(b). The micro-mirror is positioned at an angle out of-plane using electro-thermal or electrostatic actuators 66. One or more self-assembly actuators 10 are actuated to release the micro-mirror 60 while it is being actuated out-of-plane. Once the micro-mirror 60 is positioned at the desired angle, actuation of the self-assembly actuators 10 is turned off. The pistons 62, 64 of the self-assembly actuators 10 are designed to clamp onto the micro-mirror 60 in this off state. This use of self-assembly actuators 10 to hold mechanisms in place extends to micro-mechanisms other than micro-mirrors 60.

Interdigitated beams are used to create sidewall capacitors in our designs, as our structures are currently constrained to a single mechanical layer. Some previous tunable capacitor designs use parallel plates with gaps out of the plane of the substrate. Our tunable capacitor designs can be classified into two categories based on their tuning schemes. Both comb "gap tuning" and "area tuning" are used for $1^{st}$ generation capacitors, and only gap tuning is used for the $2^{nd}$ generation capacitors.

Figure 8:
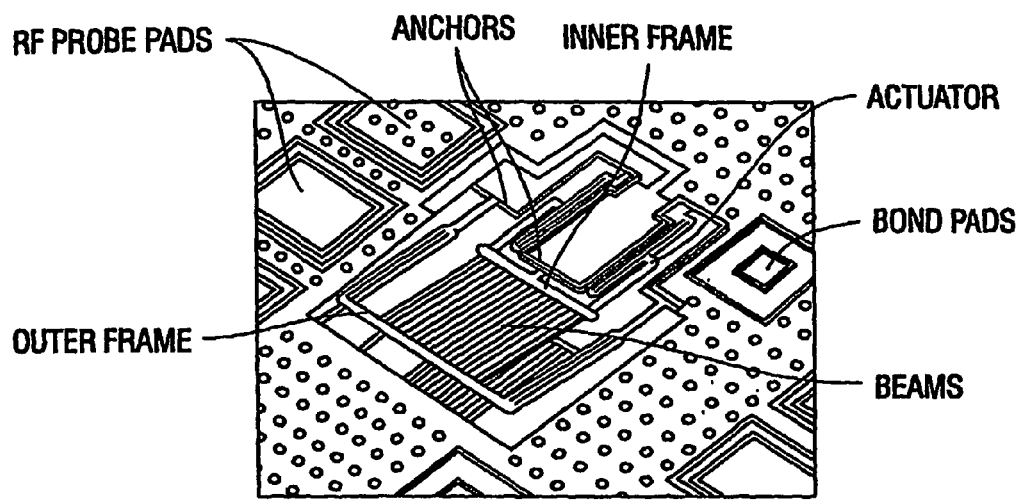
FIG. 8 is a scanning electron micrograph (SEM) of a tunable capacitor made in accordance with the $1^{st}$ generation design disclosed herein and which uses heaters for electro-thermal actuation.

Tunable capacitors were fabricated using the AMS 0.6 μm and Agilent 0.5 μm CMOS processes. Electro-thermal actuators are used for our MEMS tunable capacitor design (See FIG. 8). In contrast, some previous works used electrostatic actuators. Polysilicon resistors act as heaters inside the inner frame. Upon heating the structure, the interdigitated beams curl down vertically (out of the substrate surface plane) and also curl laterally (within the substrate surface plane). The vertical curling changes the area between interdigitated beams for tuning, and is called "area tuning." As mentioned previously, the reason of this curling behavior is that metal and oxide layers inside the beams have different TCE values. The lateral bending changes the gap between interdigitated beams for tuning, called "gap tuning." Gap tuning is achieved by exploiting the new electro-thermal actuator designs.

Figure 9A:
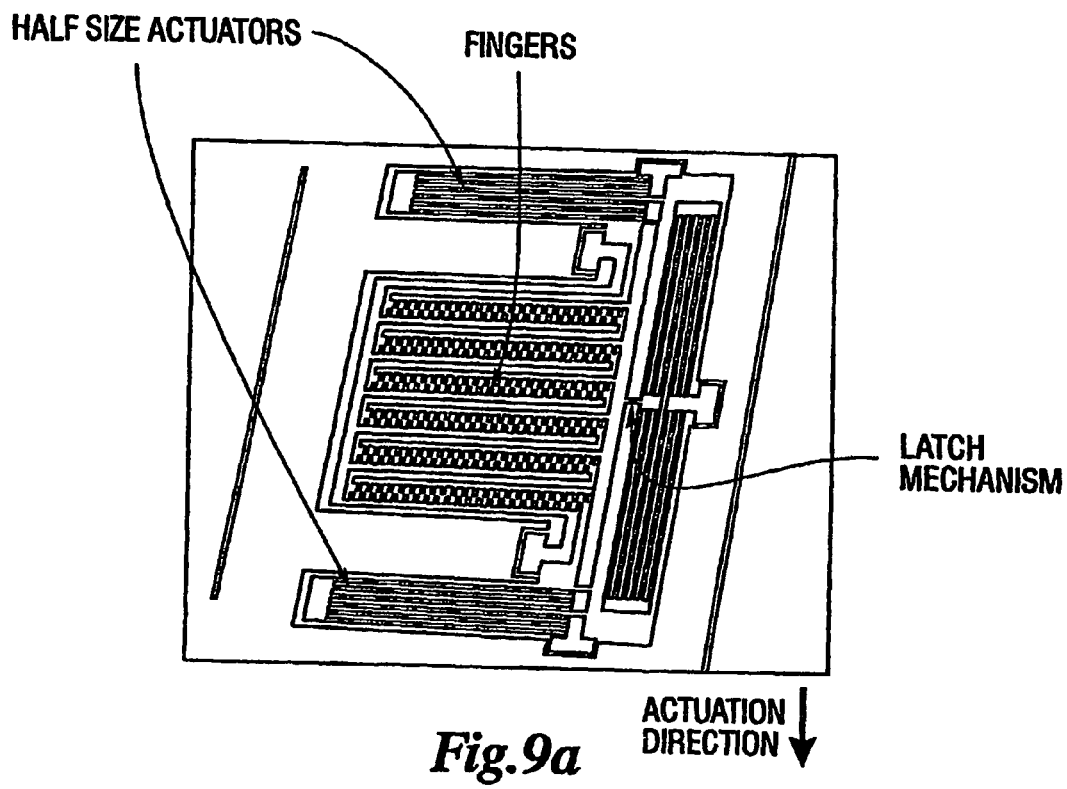
FIG. 9 (a) presents an overview of the tunable capacitor.
Figure 9B:
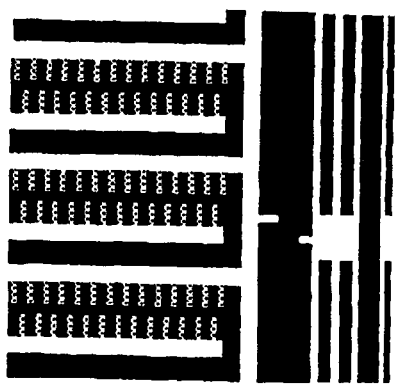
Figure 9C:
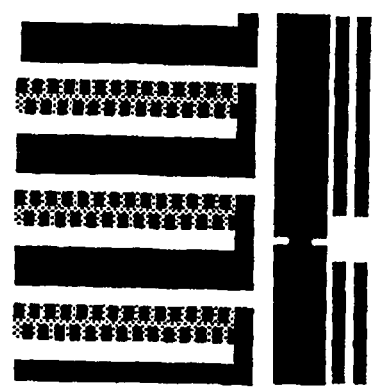

Other capacitors fabricated using TSMC 0.35 μm CMOS process are shown in FIG. 9. Gap tuning is again achieved by use of electro-thermal actuators. Small finger beams are included on larger interdigitated beams to increase the tuning range and area efficiency over the prior gap and area tuning designs. FIG. 9(a) shows a $2^{nd}$ generation released tunable MEMS capacitor with half-sized electro-thermal actuators. This "half-actuator" design uses only one half of the folded-flexure shown as a "full actuator" in FIG. 2. This half-actuator design provides the same stroke with half of the area. FIGS. 9(b) and 9(c) show a closer view of the finger parts of the tunable capacitors. The disengaged mechanism is shown in FIG. 9(b) after release without electro-thermal actuation. FIG. 9(c) shows the engaged mechanism with actuation of 12V control voltage.

One of the capacitor design goals was switching between multiple capacitor values with low power operation. For these designs, lateral electro-thermal actuators are used for implementation of lateral latch structures. By using these latch structures, we intend to consume power only when we are switching between fixed capacitance values. The latch structures in the first TSMC 0.35 μm chip did not work, as the intended self-actuation displaced in the opposite direction from the other CMOS processes used in our past experiments. Functional latches in future designs will require no power to operate statically at a given capacitance value. Previous designs consume continuous power for tuning.

Figure 10:
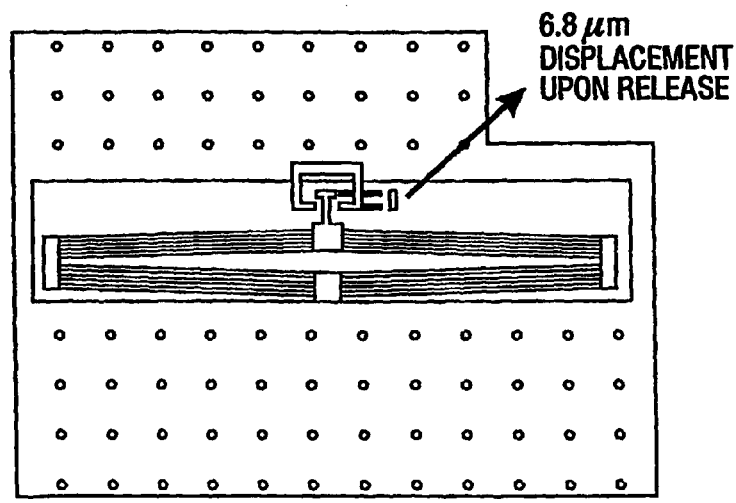
FIG. 10 is an SEM of an actuator made in accordance with the $1^{st}$ generation design disclosed herein.
Figure 11:
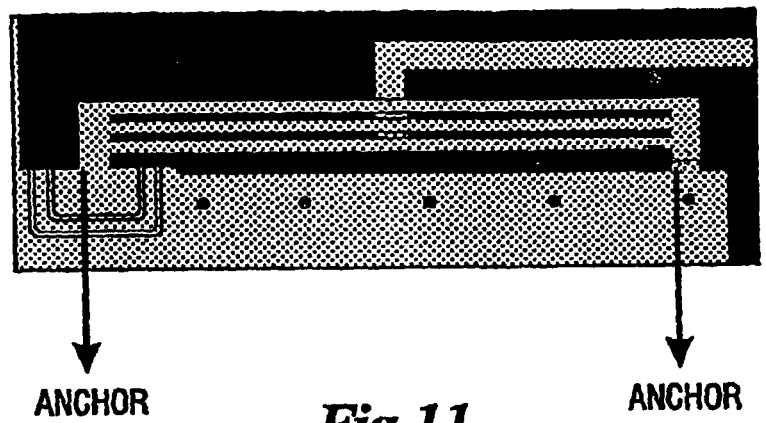
FIG. 11 is an SEM of an actuator which is anchored from both sides.

The lateral displacements are measured with an optical profilometer and an MIT microvision system. For an area of 220 μm by 20 μm, the actuators in AMS 0.6 μm CMOS displaced 6.8 μm, upon release. FIG. 10 shows the scanning electron micrograph (SEM) of the released actuator. When this actuator is heated, the structure retracts back toward its layout shape. For a controlled actuation of 4.0 μm, the structure must be heated to 150° C. FIG. 11 shows a different electro-thermal actuator design, which is anchored from both sides. Upon release, this design with a length of 100 μm and a width of 11 μm displaced 1.2 μm, which is much less compared to the folded-flexure design. The extensional stress in the fixed-fixed design limits the effectiveness of the actuation.

Figure 12:
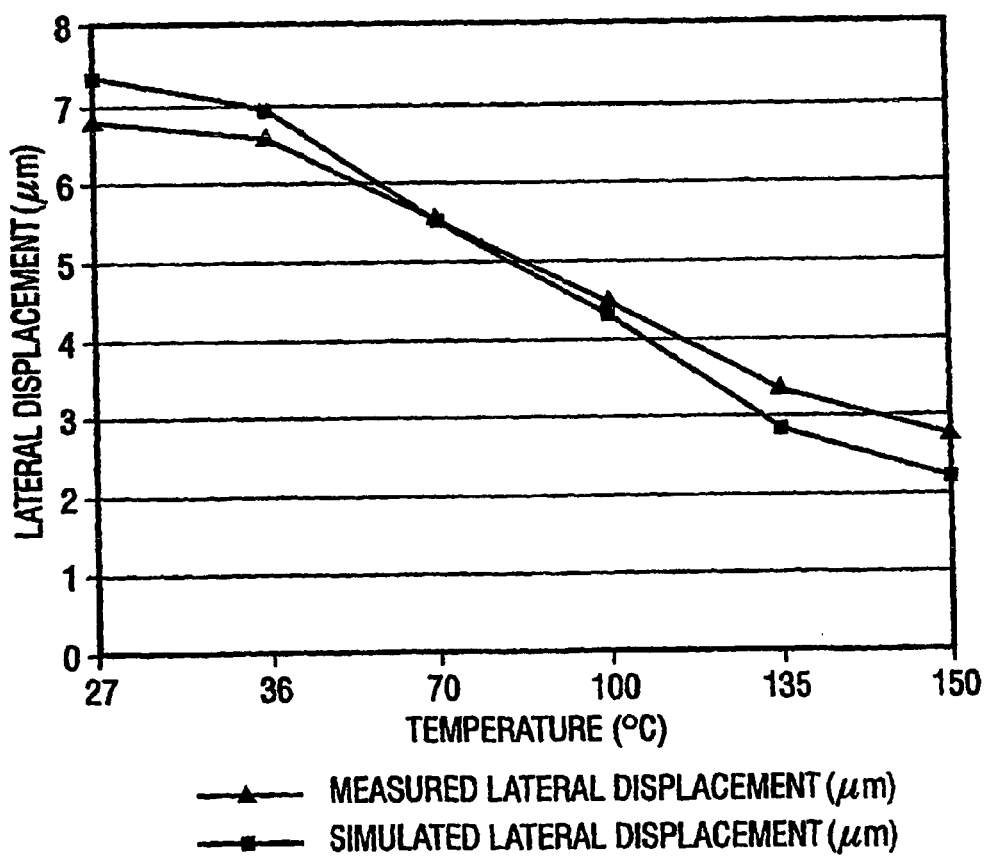
FIG. 12 is a graph showing both the predicted and the measured lateral displacement of an actuator made using the $1^{st}$ generation design.

FIG. 12 shows the simulated and measured lateral displacements for the actuator at different temperature values. There is a match between experiment and simulation data of within 10%. Table 2, shows measured lateral displacement for different size of actuators in the AMS 0.6 μm process.

TABLE 2

| Actuator Length × Actuator Width | Lateral Displacement |
| --- | --- |
| 120 μm × 22 μm | 2.9 μm |
| 170 μm × 22 μm | 4.6 μm |
| 220 μm × 22 μm | 6.8 μm |

Figure 13:
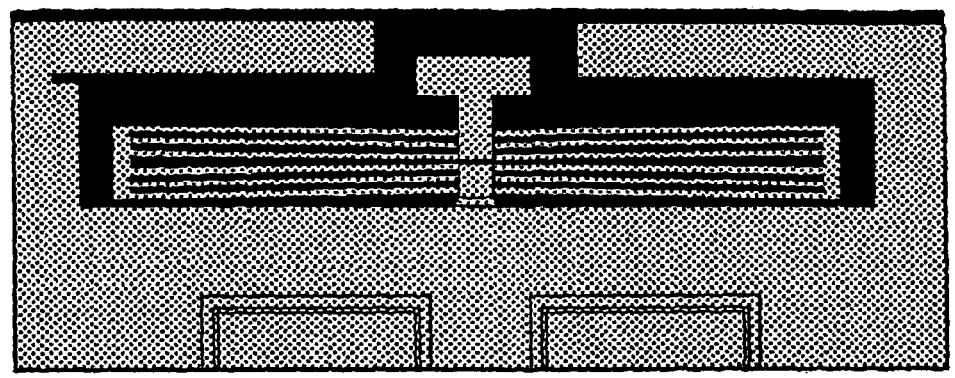
FIG. 13 is an SCM of an early actuator made in accordance with the $2^{nd}$ generation design disclosed herein. Because compressive and tensile residual stresses were different from what was anticipated, the actuator displaced in the direction opposite that which was anticipated.

In FIG. 13, an actuator in the Agilent 0.5 μm CMOS process is shown. For most CMOS-MEMS processes, the residual stress in the offset aluminum layers is tensile, while the residual stress in the surrounding silicon oxide layers is compressive. In the Agilent process, the residual stress in the aluminum layers appears to be more compressive than the surrounding silicon oxide layers, resulting in a lateral residual stress gradient in the opposite direction when compared to the AMS process. Therefore, the actuator designs in the Agilent process displaced the opposite way of the intended direction.

Figure 14:
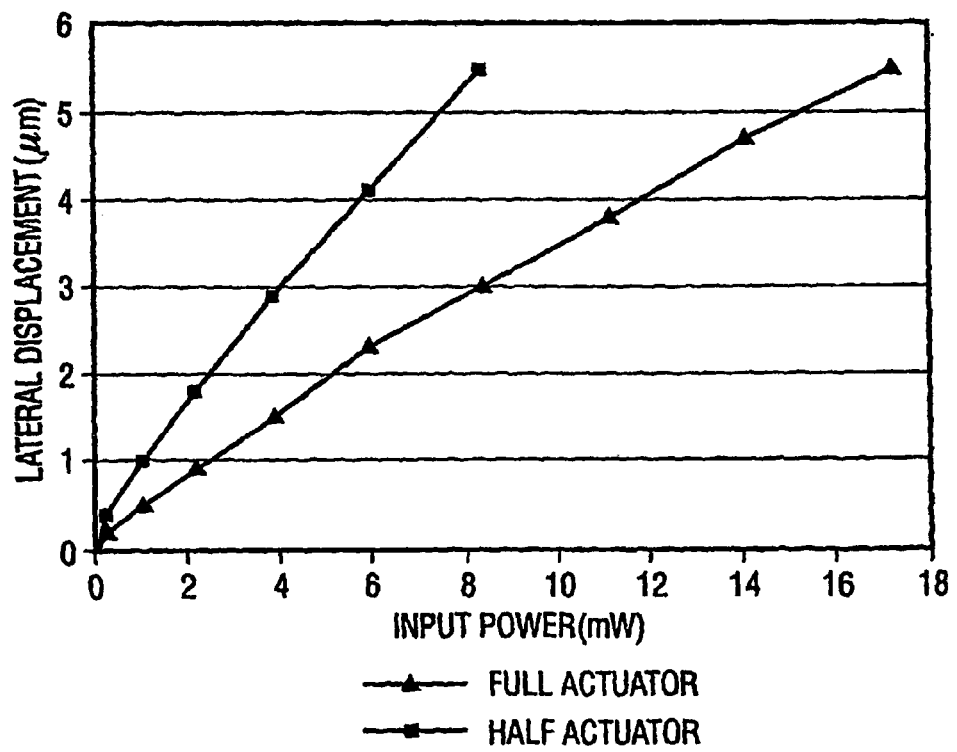
FIG. 14 shows the measured lateral deflection of actuators made in accordance with the $2^{nd}$ generation actuators. Displacements as a function of input power supplied to both "half size actuator" and "full size actuator" designs are shown.

The actuator designs in the TSMC 0.35 μm process were tested by applying DC voltage to the polysilicon heaters, as shown in FIG. 14. There are two types of actuators designated as half size and full size. The full size actuator is shown in FIG. 15, and the half size actuator is shown in FIG. 16. Half-size actuators have advantages compared to full-size actuators of more area efficiency and less power consumption. For a half-size actuator with a length of 124 μm and a width of 22 μm, 5.5 μm actuation is measured with 8.4 mW of heating power in air.

Second-generation electro-thermal actuator designs were fabricated in TSMC 0.35 μm CMOS. FIG. 15 and FIG. 16 show SEMs of the two different actuator designs as implemented for RF MEMS tunable capacitors. In FIG. 15, full-size actuators include embedded polysilicon heaters. In FIG. 16, the half-size actuators are used. The desired tuning operation was successfully tested with polysilicon heaters. Half-size actuators have advantages compared to full-size actuators of two times more area efficiency and almost half of the power consumption. The disadvantage of the half-size actuators is less stiffness. Additional beams, ideally in a symmetric arrangement, may be added into half-size actuators to increase the stiffness. Both kinds of actuators were tested by applying DC voltage to the polysilicon heaters. For the full-size actuator with a length of 224 μm and a width of 22 μm, 5.5 μm actuation is measured with 18 mW of heating power.

The summary of the experimental tunable capacitors and their measured capacitances, power and Q values are shown in Table 3.

TABLE 3

CHARACTERISTICS OF CMOS-MEMS TUNABLE CAPACITORS

| Device | Overall size(μm × μm) | $C_{MIN}$ (fF) | $C_{MAX}$ (fF) | Tuning Range | $V_{TUNE}$ (V) | Power (mW) | Q at 1.5 GHz |
|---|---|---|---|---|---|---|---|
| 1st generation design in AMS process | 170 × 220 | 153 | 175 | 14.4% | 12 | 25.5 | 24 |
| 1st generation design in Agilent process | 230 × 270 | 209 | 284 | 35.9% | 24 | 72.4 | 28 |
| TSMC design with full actuator | 228 × 250 | 42 | 148 | 352.4% | 12 | 34.2 | 52 |
| Compact TSMC design with full actuator | 228 × 230 | 40 | 98 | 245% | 12 | 27.1 | 40 |
| TSMC design with half actuator | 150 × 250 | 53 | 108 | 203.8% | 6 | 22.4 | 35 |

$S_{11}$ parameters of the 1st and 2nd generation tunable capacitors are measured using an Agilent E8364A network analyzer from 45 MHz to 3 GHz. The 1st generation designs have low tuning ratios compared to the 2nd generation designs. The reason for this low tuning range in AMS 0.6 μm CMOS process is the excessive lateral beam curling, which causes the fingers to snap together. The reason for the low tuning range in the Agilent 0.5 μm CMOS process is the behavior of the electro-thermal actuators in that process; they displaced the opposite way of the intended direction, upon release, as noted above.

For 2nd generation capacitors, large tuning ratios have been achieved, by using the finger gap tuning mechanism, instead of beam area tuning. These new capacitor designs also have higher Q values and less power consumption compared to 1st generation chips. Compact capacitors in Table 3 were designed to get the best area efficiency among TSMC designs. As shown in Table 3, the best design for area efficiency is 1st generation design in Agilent process. The TSMC designs have less area efficiency, because as it can be seen in FIG. 9(c) the engaged mechanism is not working with 100% efficiency. During the engaged process, the fingers stick at some point. Future work is being carried out to solve this problem, which will increase both area efficiency and tuning range.

Figure 17:
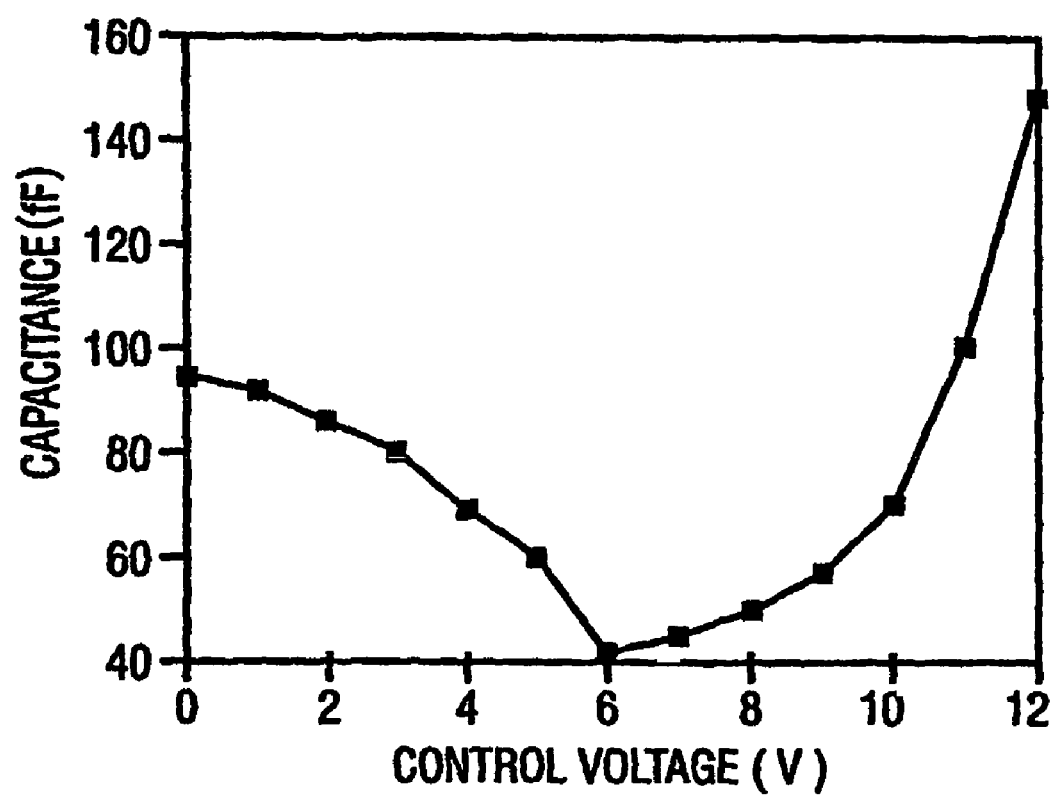
FIG. 17 illustrates the measured tuning characteristics of the 2$^{nd}$ generation design using full size actuators.

FIG. 17 shows the measured tuning characteristics of 2nd generation design in TSMC process with full-size actuators. The tuning looks linear, but the problem is the high tuning range is coming from the ratio of the capacitances at 12 V and 6 V control voltages. So with zero control voltage, the capacitance value is 95 fF, then it goes to 42 fF at 6 V control voltage, and achieves the highest value, 148 fF, at 12 V. The increase in capacitance for voltage above 6 V is due to the parallel-plate gap closing between adjacent banks of combs. This particular actuator design did not self-assemble in the intended fully engaged position due to the low residual stress. However, the electro-thermal actuation worked successfully as intended.

The implementation in high-frequency electronics processes is particularly attractive for making tuning passives for RF applications. A difference between the current work on actuators and prior similar work is the ability to design from layout, and thereby tailor, the lateral stress gradients and gradients of temperature coefficient of expansion into the actuation beams. This ability enables high displacement magnitude with small geometry and the generation of lateral movement without rotation. The large actuation stroke in CMOS processes is particularly attractive for future tunable RF capacitors with large $C_{on}$:$C_{off}$ ratio, and is an area of our active research. The impact of successfully creating such tunable on-chip passive components is in enabling the design of system-on-chip receivers. One of the biggest difficulties in designing tunable passives on chip is obtaining adequate area efficiency. Lateral displacement from the control of residual gradients can provide capability to assemble narrow nanometer gaps with zero input power. It is not possible to manufacture the nanometer-scale gaps through conventional lithography. These small gaps are essential for future applications of nanoresonator structures for use as RF filters and RF mixers. There may also be other possible applications, such as RF switches and impedance matching networks.

Figure 18:
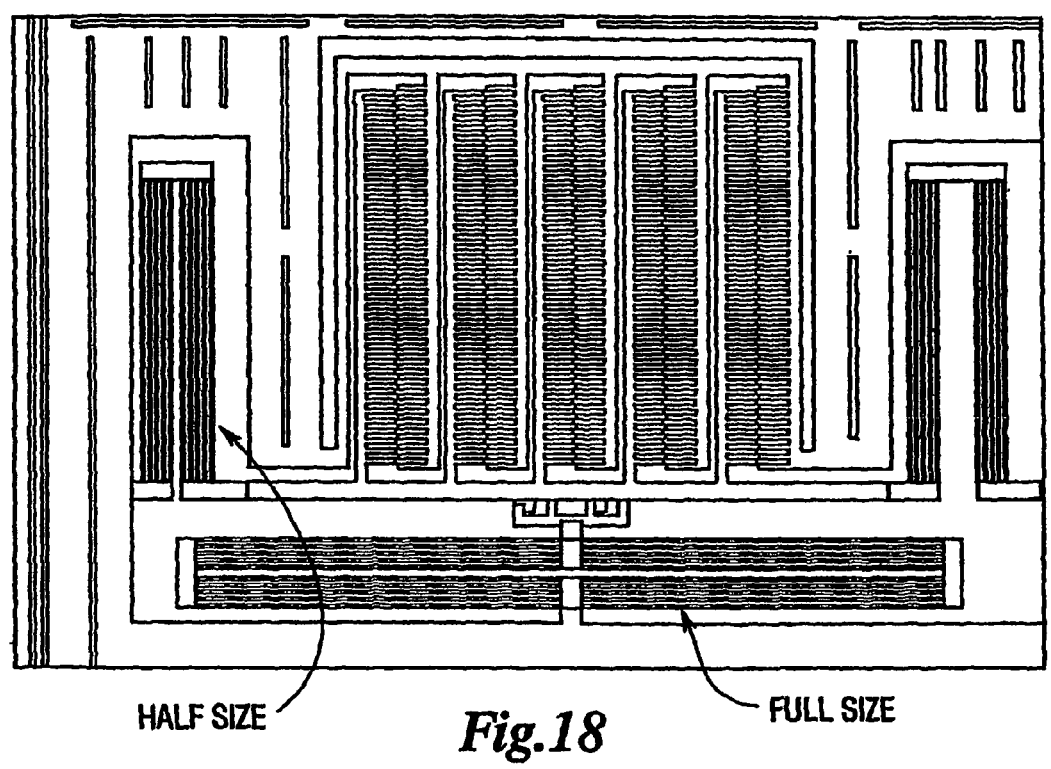
FIG. 18 shows an SEM of another tunable capacitor made in accordance with the 2$^{nd}$ generation micromover design disclosed herein.

Finally, FIG. 18 illustrates an SEM of another tunable capacitor made in accordance with the 2nd generation micromover design disclosed herein using the Jazz Semiconductor 0.35 μm BiCMOS/SiGe process.

The thick metal layers in modern RF CMOS processes can be exploited to obtain simultaneously a high tuning range with high Q. A difference between the work on capacitors and prior such work is the direct integration of tunable RF capacitors with a high tuning range into CMOS and hybrid CMOS/SiGe bipolar processes without additional post-CMOS deposition or assembly steps, enabling their use in circuits and systems on chip. The high quality factors and low parasitic capacitances of the on-chip RF-MEMS passives enables lower power RF systems. The 2nd generation tunable capacitor achieves a large tuning range, up to 3.52:1. For future work, the latch mechanism for low power design will be implemented and the reasons for the sticking problem between fingers will be investigated. These efforts will lead to eventual optimization of the tuning range and area efficiency. Modeling results predict that a tuning range of at least 9:1 is achievable.

While the present disclosure has been described in connection with preferred embodiments thereof, those of ordinary skill in the art will recognize that many modifications and variations are possible. The present invention is intended to be limited only by the following claims and not by the foregoing description which is intended to set forth the presently preferred embodiment.

What is claimed is:
1. A MEMS device, comprising:
an in-plane, self-assembling, beam comprised of at least two different horizontally stacked materials laterally offset in the same plane from a vertical dividing line along said beam.

2. The device of claim 1 additionally comprising a plurality of in-plane, self-assembling beams connected in parallel.

3. The device of claim 1 additionally comprising a plurality of in-plane, self-assembling beams connected in series, with said series connected beams connected in parallel.

4. A MEMS device, comprising:
a first leg having a fixed end and a movable end, said first leg having at least one in-plane, self-assembling, beam comprised of at least two different horizontally stacked materials laterally offset in the same plane from a vertical dividing line along said beam;
a second leg having a first end connected to said movable end of said first leg, and a second end, said second leg having at least one in-plane, self-assembling, beam comprised of at least two different horizontally stacked materials laterally offset in the same plane from a vertical dividing line along said beam; and
an actuator carried by said second end of said second leg.

5. The device of claim 4 wherein said first leg is constructed of a plurality of parallel beams and wherein said second leg is constructed of a plurality of parallel beams.

6. A MIEMS device, comprising:
a first leg having a fixed portion and two movable ends, said first leg having at least one in-plane, self-assembling, beam comprised of at least two different horizontally stacked materials laterally offset in the same plane from a vertical dividing line along said beam;
a second leg having a first end connected to one of said movable ends of said first leg and a second end connected to the other of said movable ends of said first leg, said second leg having at least one in-plane, self-assembling, beam comprised of at least two different horizontally stacked materials laterally offset in the same plane from a vertical dividing line along said beam; and
an actuator carried by said second leg.

7. The device of claim 6 wherein said first leg is constructed of a plurality of serially connected pairs of beams in parallel with one another and wherein said second leg is constructed of a plurality of serially connected pairs of beams in parallel with one another.

8. The device of claim 6 wherein said first leg is constructed of at least one pair of serially connected beams and wherein said second leg is constructed of at least one pair of serially connected beams.

9. The MIEMS device of claim 1 wherein said two materials are arranged so as to provide an in-plane stress gradient of sufficient magnitude to enable said beam to move in-plane upon the beam's release.

10. The device of claim 9 wherein said two materials include a metal and a dielectric arranged about said vertical dividing line such that there is more metal than dielectric on one side of said line and more dielectric than metal on the other side of said line.

11. The device of claim 9 wherein said stress gradient is a function of beam length.

12. The device of claim 9 wherein one of said two materials has a greater compressive force than the other of said two materials.

13. The device of claim 9 wherein one of said two materials has a greater tensile stress than the other of said two materials.

14. The device of claim 9 wherein one of said two materials has a compressive stress and the other of said two materials has a tensile stress.

15. The device of claim 9 additionally comprising a thermal heater.

16. The device of claim 15 wherein said thermal heater provides a thermally induced stress gradient.

17. The device of claim 15 wherein one of said two materials has a coefficient of thermal expansion greater than a coefficient of thermal expansion of the other of said two materials.

18. The device of claim 1 additionally comprising an actuator carried by said beam.

19. A device constructed according to claims 4 or 6 additionally comprising a second device comprising an in-plane, self-assembling, beam comprised of at least two different horizontally stacked materials laterally offset in the same plane from a vertical dividing line along said beam, said second device positioned with respect to said first device such that an actuator of the second device may engage said actuator of the first device.

20. The device of claim 19 wherein said second device is positioned orthogonally with respect to said first device.

21. The device of claim 19 wherein said actuator of the second device carries a surface configured to engage the first device.

22. A device constructed according to claims 4 or claim 6 additionally comprising a second device comprising an in-plane, self-assembling, beam comprised of at least two different horizontally stacked materials laterally offset in the same plane from a vertical dividing line along said beam, said beam being capable of out of plane movement, and wherein said device is positioned with respect to said second device such that said actuator of said device may inhibit the movement of said second device.

23. A MEMS device constructed according to claims 4, 6 or 18 additionally comprising a variable capacitor having a plurality of capacitive surfaces connected to said actuator.

24. A MEMS device constructed according to claims 4, 6 or 18 said device defining a nano-meter sized gap, comprising:
a stop surface having a recess formed therein so as to define one side of the gap;
said actuator designed to engage said stop surface and to provide the other side of said gap.

25. The MEMS device of claim 21 wherein said actuator of the second device carries a surface configured to engage the first device in a self-aligning manner.

26. A method of building an in-plane, self-assembling MEMS beam, comprising:
forming horizontal layers of two different materials to form a beam, wherein said two different materials are laterally offset in the same plane from a vertical dividing line along said beam such that the beam has an in-plane stress gradient of sufficient magnitude to enable said beam to move in-plane upon the beam's release.

27. The method of claim 26 wherein said two materials include a metal and a dielectric arranged about said dividing line such that there is more metal than dielectric on one side of said line and more dielectric than metal on the other side of said line.

28. The method of claim 27 additionally comprising forming metal filled vias in said beam, laterally offset from said vertical dividing line.

29. The method of claim 26 where said method is performed using CMOS processing procedures.

30. The method of claim 26 wherein said stress gradient is a function of beam length.

31. The method of claim 26 wherein said two materials are selected such that one of said two materials has a greater compressive stress than the other of said two materials.

32. The method of claim 26 wherein said two materials are selected such that one of said two materials has a greater tensile stress than the other of said two materials.

33. The method of claim 26 wherein said two materials are selected such that one of said two materials has a compressive stress and the other of said two materials has a tensile stress.

34. The method of claim 26 wherein said two materials are selected such that upon heating a thermally induced stress gradient is generated.

35. The method of claim 34 wherein said two materials are selected such that one of said two materials has a coefficient of thermal expansion greater than a coefficient of thermal expansion of the other of said two materials.

* * * * *

UNITED STATES PATENT AND TRADEMARK OFFICE
CERTIFICATE OF CORRECTION

PATENT NO. : 7,749,792 B2
APPLICATION NO. : 10/558469
DATED : July 6, 2010
INVENTOR(S) : Gary K Fedder and Altug Oz It is certified that error appears in the above-identified patent and that said Letters Patent is hereby corrected as shown below:

Column 17, Line 22, delete "MIEMS" and substitute therefore -- MEMS --.

Column 17, Line 45, delete "MIEMS" and substitute therefore -- MEMS --.

Column 18, Line 20, delete "claims 4" and substitute therefore -- claim 4 --.

Signed and Sealed this

Thirty-first Day of August, 2010

David J. Kappos
*Director of the United States Patent and Trademark Office*